(12) United States Patent
Nguyen et al.

(10) Patent No.: US 7,295,088 B2
(45) Date of Patent: Nov. 13, 2007

(54) HIGH-Q MICROMECHANICAL RESONATOR DEVICES AND FILTERS UTILIZING SAME

(75) Inventors: Clark T.-C. Nguyen, Arlington, VA (US); Sheng-Shian Li, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 16 days.

(21) Appl. No.: 11/040,766

(22) Filed: Jan. 21, 2005

(65) Prior Publication Data
US 2005/0206479 A1 Sep. 22, 2005

Related U.S. Application Data

(60) Provisional application No. 60/537,822, filed on Jan. 21, 2004.

(51) Int. Cl.
*H03H 9/02* (2006.01)
*H03H 9/46* (2006.01)
*H03H 9/48* (2006.01)

(52) U.S. Cl. ........................ 333/186; 333/199
(58) Field of Classification Search ............. 333/186, 333/197, 199; 310/309; 331/154
See application file for complete search history.

(56) References Cited

U.S. PATENT DOCUMENTS

| | | | | |
|---|---|---|---|---|
| 5,537,083 | A * | 7/1996 | Lin et al. ................ | 333/186 |
| 6,686,807 | B1 * | 2/2004 | Giousouf et al. ........ | 331/154 |
| 6,985,051 | B2 * | 1/2006 | Nguyen et al. ........... | 333/186 |

OTHER PUBLICATIONS

Nguyen, Clark T.-C., Vibrating RF MEMS for Next Generation Wireless Applications, Proceedings, 2004 IEEE Custom Integrated Circuits Conference, Orlando, Florida, Oct. 3-6, 2004, pp. 257-264.
Abidi, Asad A., Direct-Conversion Radion Transceivers for Digital Communications, IEEE J. Solid-State Circuits, vol. 30, No. 12, Dec. 1995, pp. 1399-1410.
Yue, C. Patrick, et al., On-Chip Spiral Inductors with Patterned Ground Shields for Si-Based RF IC's, IEEE J. of Solid-State Circuits, vol. 33, No. 5, May 1998, pp. 743-752.
Nguyen, Clark T.-C., Transceiver Front-End Architectures Using Vibrating Micromechanical Signal Processors, Digest of Papers, Topical Meeting on Silicon Monolithic Integrated Circuits in RF Systems, Sep. 12-14, 2001, pp. 23-32.

(Continued)

*Primary Examiner*—Dean Takaoka
(74) *Attorney, Agent, or Firm*—Brooks Kushman P.C.

(57) ABSTRACT

High-Q micromechanical resonator devices and filters utilizing same are provided. The devices and filters include a vibrating polysilicon micromechanical "hollow-disk" ring resonators obtained by removing quadrants of material from solid disk resonators, but purposely leaving intact beams or spokes of material with quarter-wavelength dimensions to non-intrusively support the resonators. The use of notched support attachments closer to actual extensional ring nodal points further raises the Q. Vibrating micromechanical hollow-disk ring filters including mechanically coupled resonators with resonator Q's greater than 10,000 achieve filter Q's on the order of thousands via a low-velocity coupling scheme. A longitudinally mechanical spring is utilized to attach the notched-type, low-velocity coupling locations of the resonators in order to achieve a extremely narrow passband.

48 Claims, 8 Drawing Sheets

OTHER PUBLICATIONS

Huang, Xue Ming Henry, et al., Nanodevice Motion at Microwave Frequencies, Nature, vol. 421, Jan. 30, 2003, pp. 496.

Vig, John R., et al., Noise in Microelectromechanical System Resonators, IEEE Trans Utrason, Ferroelec. Freq. Contr. vol. 46, No. 6, Nov. 1999, pp. 1558-1565.

Wang, Jing, et al., Self-Aligned 1.14-GHZ Vibrating Radial-Mode Disk Resonators, Digest of Technical Papers, Transducers 2003, Boston, Massachusetts, Jun. 8-12, 2003, pp. 947-950.

Bircumshaw, Brian, et al., The Radial Bulk Angular Resonator: Towards A 50Ω RF MEMS Filter, Digest of Technical Papers, Transducers 2003, Boston, Massachusetts, Jun. 8-12, 2003, pp. 875-878.

Abdelmoneum, Mohamed A., et al., Stemless Wine-Glass-Mode Disk Micromechanical Resonators, Proceedings, 16th Int. IEEE MEMS Conf., Kyoto Japan, Jan. 19-23, 2003, pp. 698-701.

Wang, Jing, et al., 1.51-Ghz Nanocrystalline Diamond Micromechanical Disk Resonator With Material-Mismatched Isolating Support, Proceedings, 17th Int. IEEE MEMS Conf., Maastricht, The Netherlands, Jan. 25-29, 2004, pp. 641-644.

Clark, John R., et al., Parallel-Resonator HF Micromechanical Bandpass Filters, Digest of Technical Papers, Transducers '97, Chicago, Illinois, Jun. 16-19, 1997, 1997, pp. 1161-1164.

Demirci, M.U., et al., Mechanically Corner-Coupled Square Microresonator Array for Reduced Series Motional Resistance, Digest of Technical Papers, Transducers '03, Boston, Massachusetts, Jun. 8-12, 2003, pp. 955-958.

Iula, Antonio, et al., A Model for the Theoretical Characterization of Thin Piezoceramic Rings, IEEE Transactions on Ultrasonic, Ferroelectrics, and Frequency Control, vol. 43, No. 3, 1996, pp. 370-375.

Bannon, Frank D., et al., High-Q HF Microelectromechanical Filters, IEEE J. Solid-State Circuits, vol. 35, No. 4, Apr. 2000, pp. 512-526.

Navid, Reza, et al., Third-Order Intermodulation Distortion in Capacitively-Driven CC-Beam Micromechanical Resonators, Technical Digest, 14th Int. IEEE MEMS Conf., Interlaken, Switzerland, Jan. 21-25, 2001, pp. 228-231.

Wong, Ark-Chew, et al., Micromechanical Mixer+Filters, Technical Digest, IEEE Int. Electron Devices Meeting, San Francisco, California, Dec. 6-9, 1998, pp. 471-474.

International Search Report And Written Opinion of The International Searching Authority for corresponding International application PCT/US//05/02076.

Shirator, Norihiko, et al., Temperature Characteristic Compensation of a Miniature Bi-Axial Gyro-Sensor Using a Disk-Type Resonator, Japanese Journal of Applied Physics, vol. 38, Part 1, No. 9B, Sep. 1999, pp. 5586-5591.

House R.N., et al., An Analytic Study of the Vibrating Free Disk, IRE Transactions on Ultrasonics Engineering, National Ultrasonics Symposium, Stanford, California, Aug. 17, 1959, 76-84.

Oh, Sang-Kyoung, et al., A Study on The Skipping of Compact Disk Player, IEEE Transactions on Consumer Electronics, vol. 38, No. 3, Aug. 1992, pp. 208-213.

* cited by examiner

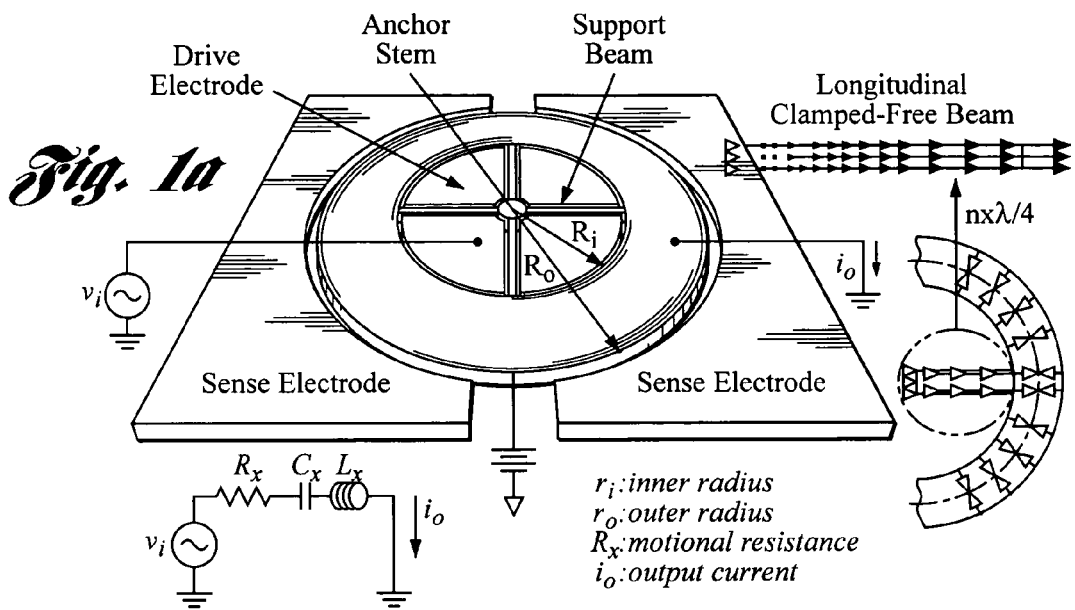
Fig. 1a
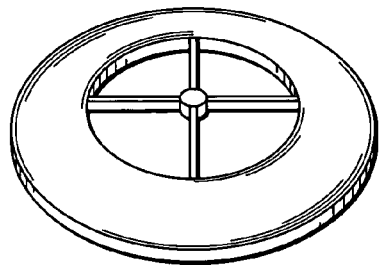
Fig. 1b
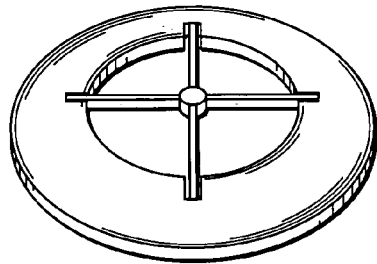
Fig. 1c
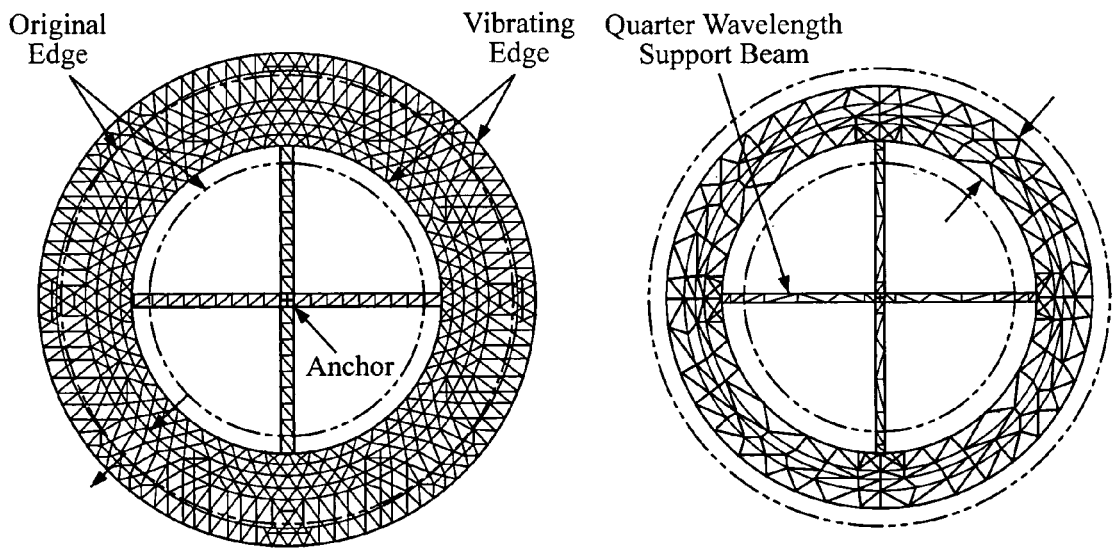
Fig. 2a
Fig. 2b

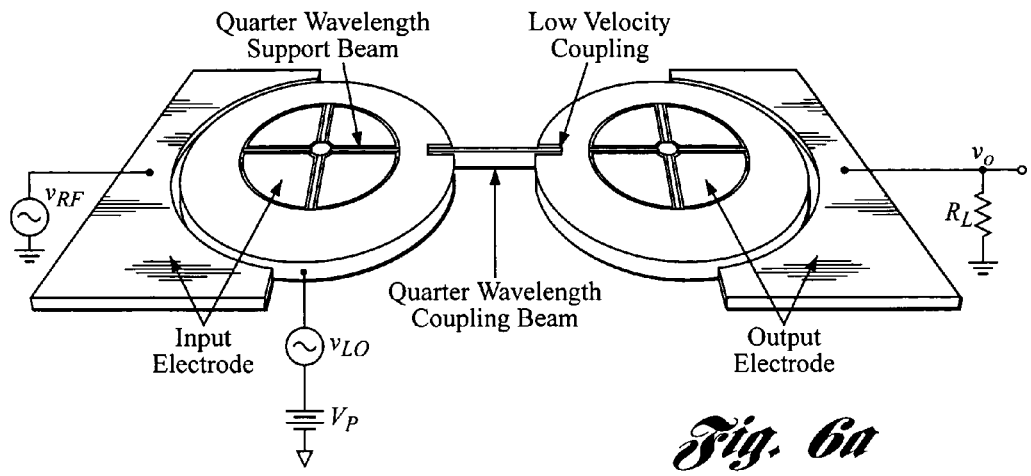
Fig. 6a
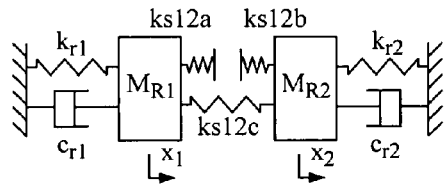
Fig. 6b
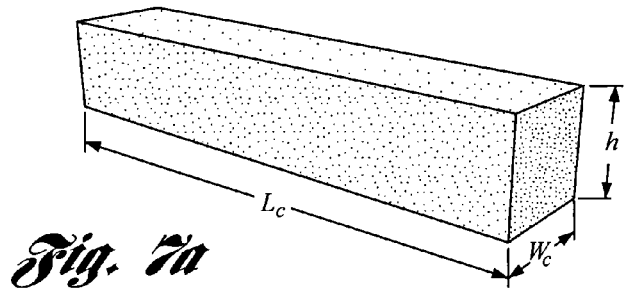
Fig. 7a
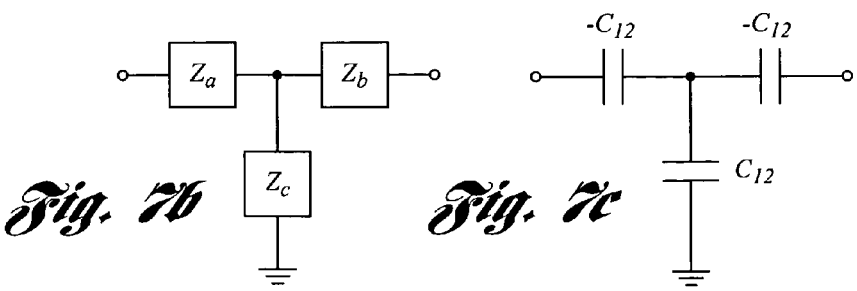
Fig. 7b  Fig. 7c

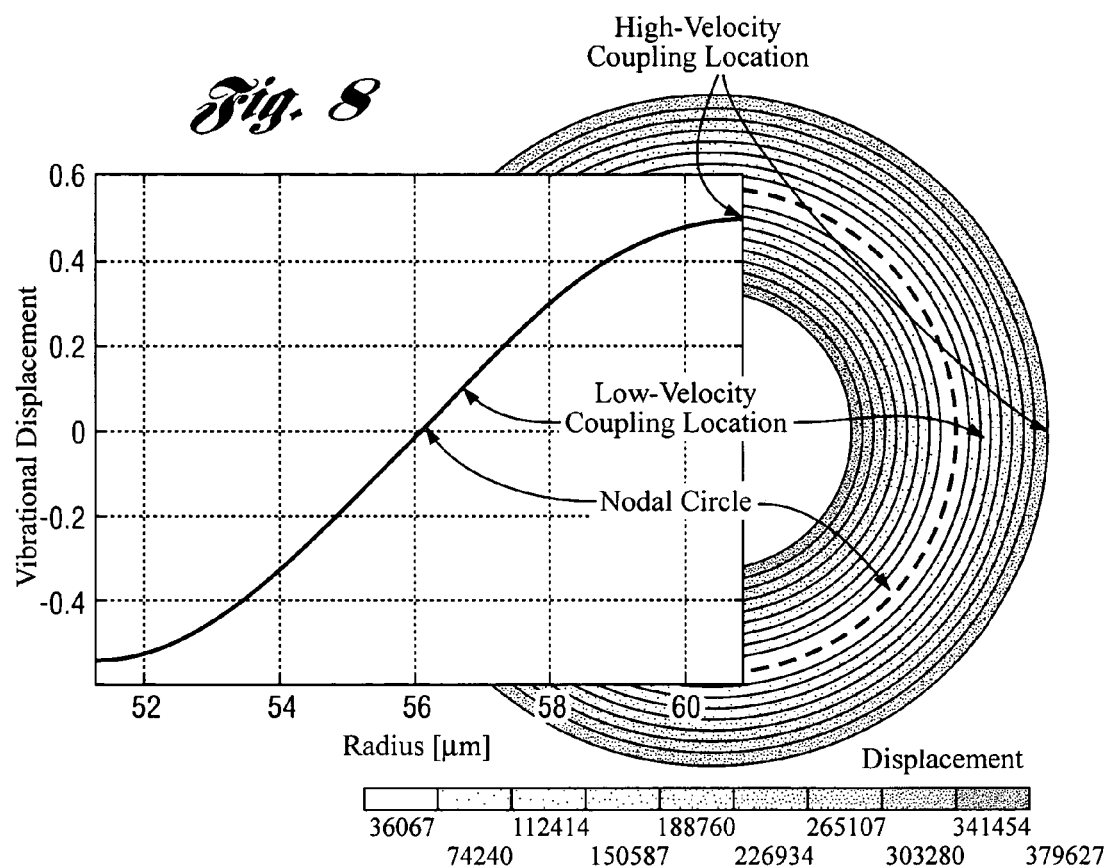
Fig. 8
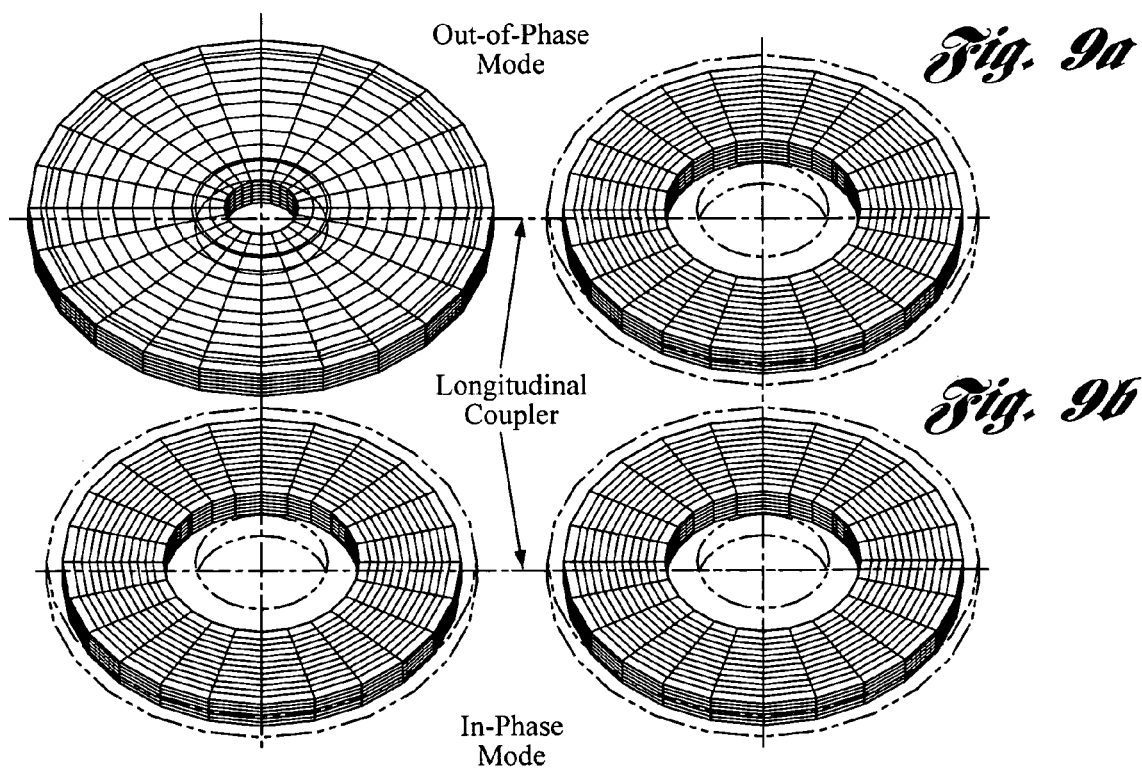
Fig. 9a
Fig. 9b

HIGH-Q MICROMECHANICAL RESONATOR DEVICES AND FILTERS UTILIZING SAME

CROSS-REFERENCE TO RELATED APPLICATIONS

This application claims the benefit of U.S. provisional application Ser. No. 60/537,822, filed Jan. 21, 2004 and entitled "Hollow Disk Micromechanical Resonator." This application is related to application Publication No. 2004/0207492 A1 (now U.S. Pat. No. 6,985,051) and U.S. application Ser. No. 10/990,785, filed Nov. 17, 2004 and entitled "Micromechanical Resonator Device Having a Desired Mode Shape," both of which are incorporated in their entirety by reference herein.

STATEMENT REGARDING FEDERALLY SPONSORED RESEARCH OR DEVELOPMENT

This invention was made with Government support from the National Science Foundation under Contract No. 9986866. The Government has certain rights in the invention.

BACKGROUND OF THE INVENTION

1. Field of the Invention

This invention relates to high-Q micromechanical resonator devices and filters utilizing same.

2. Background Art

The following references are referenced herein:

[1] C. T.-C. Nguyen, "Vibrating RF MEMS for next Generation Wireless Applications," PROCEEDINGS, 2004 IEEE CUSTOM INTEGRATED CIRCUITS CONF., Orlando, Fla., Oct. 3-6, 2004, pp. 257-264.

[2] A.A. Abidi, "Direct-conversion Radio Transceivers for Digital Comms," IEEE J. SOLID-STATE CIRCUITS, vol. 30, No. 12, pp. 1399-1410, Dec. 1995.

[3] C. P. Yue and S.S. Wong, "On-Chip Spiral Inductors with Patterned Ground Shields for Si-Based RF IC's," IEEE JOURNAL OF SOLID-STATE CIRCUITS, vol. 33, no. 5, pp. 743-752, May 1998.

[4] C. T.-C. Nguyen, "Transceiver Front-end Architectures Using Vibrating Micromechanical Signal Processors (Invited)," DIG. OF PAPERS, TOPICAL MEETING ON SILICON MONOLITHIC INTEGRATED CIRCUITS IN RF SYSTEMS, Sep. 12-14, 2001, pp. 23-32.

[5] C. T.-C. Nguyen, "Transceiver Front-end Architectures Using Vibrating Micromechanical Signal Processors," CHAPTER IN RF TECHNOLOGIES FOR LOW POWER WIRELESS COMMUNICATIONS, Edited by G.I. Haddad, T. Itoh, and J. Harvey, pp. 411-461, New York: WILEY IEEE-PRESS, 2001.

[6] X. M. H. Huang, C.A. Zorman, M. Mehregany, M.L. Roukes, "Nanodevice Motion at Microwave Freqs," NATURE, vol. 421, pg. 496, Jan. 30, 2003.

[7] J.R. Vig and Y. Kim, "Noise in Microelectromechanical System Resonators," IEEE TRANS. UTRASON. FERROELEC. FREQ. CONTR., vol. 46, no. 6, pp. 1558-1565, Nov. 1999.

[8] J. Wang, Z. Ren, and C. T.-C. Nguyen, "Self-aligned 1.14-GHz Vibrating Radial-Mode Disk Resonators," DIG. OF TECH PAPERS, TRANSDUCERS'03, Boston, Mass., Jun. 8-12, 2003, pp. 947-950.

[9] B. Bircumshaw, et al., "The Radial Bulk Annular Res.: Towards a 50 ΩMEMS Filter," DIG. OF TECH PAPERS, TRANSDUCERS '03, Boston, Mass., Jun. 8-12, 2003, pp. 875-878.

[10] M. A. Abdelmoneum, M.U. Demirci, and C.T.-C. Nguyen, "Stemless Wine-glass-mode Disk Micromechanical Resonators," PROCEEDINGS, 16TH INT. IEEE MEMS CONF., Kyoto, Japan, Jan. 19.-23, 2003, pp. 698-701.

[11] J. Wang, J.E. Butler, T. Feygelson, and C.T.-C. Nguyen, "1.51-GHz Polydiamond Micromechanical Disk Resonator with Impedancemismatched Isolating Support," PROCEEDINGS, 17TH INT. IEEE MEMS CONF., Maastricht, The Netherlands, Jan. 25-29, 2004, pp. 641-644.

[12] J.R. Clark, A.-C. Wong, and C.T.-C. Nguyen, "Parallel-resonator Hf Micromechanical Bandpass Filters," DIG. OF TECH. PAPERS, TRANSDUCERS '97, Chicago, Ill., Jun. 16-19, 1997, pp. 1161-1164.

[13] M. U. Demirci, M. A. Abdelmoneum, and C. T.-C. Nguyen, "Mechanically Corner-coupled Square Microresonator Array for Reduced Series Motional Resistance," DIG. OF TECH. PAPERS, TRANSDUCERS '03, Boston, Mass., June 8-12, 2003, pp. 955-958.

[14] Antonio Iula, Nicola Lamberti, and Massimo Pappalardo, "A Model for the Theoretical Characterization of Thin Piezoceramic Rings," IEEE TRANSACTIONS ON ULTRASONIC, FERROELECTRICS, AND FREQUENCY CONTROL, Vol. 43, No. 3, 1996, pp. 370-375.

[15] F. D. Bannon III, J. R. Clark, and C. T.-C. Nguyen, "High Frequency Micromechanical Filters," IEEE J. SOLID-STATE CIRCUITS, vol. 35, no. 4, pp. 512-526, Apr. 2000.

[16] R. Navid, J. R. Clark, M. Demirci, and C. T.-C. Nguyen, "Third-order Intermodulation Distortion in Capacitively-Driven CC-beam Micromechanical Resonators," TECHNICAL DIGEST, 14TH INT. IEEE MEMS CONF., Interlaken, Switzerland, Jan. 21-25, 2001, pp. 228-231.

[17] A.-C. Wong, H. Ding, and C. T.-C. Nguyen, "Micromechanical Mixer+Filters," TECHNICAL DIGEST, IEEE INT. ELECTRON DEVICES MEETING, San Francisco, Calif., Dec. 6-9, 1998, pp. 471-474.

Nomenclature $r_i$, $r_o$, H Element dimensions (m).
r, θ, z Polar coordinates.
T Stress tenor (Pa).
$c_{ij}^E$ Elastic stiffness constant (Pa).
ρ Mass density (kg·m$^{-3}$).
$u_r$, $U_r$ Displacement along the radial direction (m), displacement amplitude (m).
ω Angular frequency (rad·s$^{-1}$).
t Time (s).
h Frequency parameter (rad·m$^{-1}$).
VPhase wave velocity along the radial direction (m·s$^{-1}$).
σ Poisson's ratio.
$i_o$, $I_o$ Output motional current (A), current amplitude (A).
q Electrical charge (C).
η Elecromechanical coupling coefficient (N/V).
X Mode displacement (m).
F Electrostatic force (N).
k Stiffness constant (N·M$^{-1}$).
Q Quality factor.
$R_x$ Motional resistance (Ω).
$v_i$, $V_i$ Input ac voltage (V), voltage amplitude (V).
C Time-varying capacitance (F).
$d_0$ Electrode-to-resonator gap spacing (m).

A Electrode-to-resonator overlap area (m$^2$).
$\epsilon_0$ Permittivity in vacuum (=8.854×10$^{-12}$ F·m$^{-1}$).

Introduction

Today's wireless transceivers are generally designed under a mandate to minimize or eliminate the use of high-Q passives. The reasons for this are quite simple: cost and size. Specifically, the ceramic filters, SAW filters, quartz crystals, and now FBAR filters, capable of achieving the Q's from 500 to 10,000 needed for RF and IF bandpass filtering, and frequency generation functions, are all off-chip components that must interface with transistor circuits at the board-level, consuming excessive area and costing too much [1].

Pursuant to reducing the off-chip parts in modern cellular handsets, direct-conversion receiver architectures [2] have removed the IF filter, and integrated inductor technologies are removing some of the off-chip inductors used for bias and matching networks [3]. Although these methods can lower cost, they often do so at the expense of increased transistor circuit complexity and more stringent requirements on circuit performance, both of which degrade the robustness and power efficiency of the overall system. In addition, the removal of the IF filter does little to relax the requirements of future multi-band reconfigurable handsets that will likely require high-Q RF filters in even larger quantities.

Recent advances in vibrating RF micromechanical systems ("MEMS") technology that have yielded on-chip resonators operating past GHz frequencies with Q's in excess of 10,000, may now not only provide an attractive solution to present day communication systems, but might also enable a paradigm-shift in transceiver design where the advantages of high-Q are emphasized, rather than suppressed [4][5]. In particular, like transistors, micromechanical elements can be used in large quantities without adding significant cost. This not only brings more robust superheterodyne architectures back into contention, but also encourages modifications to take advantage of a new abundance of low loss ultra-high-Q frequency shaping at GHz frequencies. For example, an RF channel select filter bank may now be possible, capable of eliminating not only out-of-band interferers, but also out-of-channel interferers, and in doing so, relaxing the dynamic range requirements of the LNA and mixer, and the phase noise requirements of the local oscillator, to the point of perhaps allowing complete transceiver implementations using very low cost transistor circuits.

A major impetus behind MEMS technology stems from the fact that mechanical mechanisms benefit from the same scaling-based advantages that have driven the integrated circuit revolution in recent decades. Specifically, small size leads to faster speed, lower power consumption, higher complexity, and lower cost. And it does so not only in the electrical domain, but in virtually all other domains, including and especially mechanical. Although many examples of this from all physical domains exist, vibrating RF MEMS resonators perhaps provide the most direct example of how small size leads to faster speed in the mechanical domain. Basically, further scaling down to nano-dimensions does indeed yield frequencies in excess of 1 GHz [6]. However, as with nanoelectronics in the electrical domain, there are issues in the mechanical domain that might hinder the use of nanomechanical vibrating resonators for today's communication purposes. In particular, excessive scaling may lead to "scaling-induced limitations," such as adsorption-desorption noise [7], temperature fluctuation noise, and insufficient power handling, with the last of these perhaps being the most serious for present day applications. As with nanoelectronics, the power handling issue with nanomechanical resonators really boils down to an impedance matching problem. In brief, nanostructures would rather operate at higher impedance levels than macroscopic counterparts, and in order to interface the nano with the macro (e.g., the antenna), impedance matching strategies like massive arraying of nanostructures to add their responses might be required.

Fortunately, massive-scale arraying isn't really needed, at least not for the frequency range used by present day commercial wireless standards. In particular, GHz frequencies can be attained mechanically without the need for nano-scale dimensions, and thus, without its associated power handling issues, by merely using ring resonator geometry that operate in modes more amenable to higher frequency.

Wireless communication receivers could be greatly simplified if communication channels (rather than bands of channels) could be selected right at RF, immediately after the antenna, with out-of-channel noise and interferers removed before the received signal reaches any transistor circuits. With such an RF channel-selection capability, a wireless receiver might dispense with multi-stage down-conversion circuits, and instead, utilize a direct sub-sampling A/D converter right at the front end. Unfortunately, RF channel-selection is extremely difficult, because it requires at least 0.1% bandwidth selectivity, which, in turn, requires filters using resonators with Q's >10,000 to maintain acceptable insertion loss (below 1 dB). Although on-chip MEMS-based vibrating resonators have very recently reached frequencies past 1 GHz [8], they have so far not done so with Q's as high as 10,000. Even off-chip resonators in use today, such as SAW's or FBAR's, exhibit Q's about an order of magnitude lower than the needed 10,000.

SUMMARY OF THE INVENTION

An object of the present invention is to provide improved high-Q micromechanical resonator devices and filters utilizing same.

In carrying out the above object and other objects of the present invention, a micromechanical resonator device having a desired mode shape is provided. The device includes a substrate and a hollow resonator having a central cavity and a stationary surface area. The desired mode shape is characterized by a plurality of interior nodal points located between the cavity and an outer periphery of the resonator. The desired mode shape involves movement of only a fraction of the stationary surface area at resonance. A non-intrusive support structure is anchored to the substrate and includes a hub disposed within the cavity and a plurality of spokes which radiate from the hub and support the resonator above the substrate to reduce mechanical losses to the substrate.

The resonator may have a desired resonance frequency, and the spokes may have a length based on the desired resonance frequency to reduce mechanical losses to the substrate.

The spokes may have inner and outer ends, and the outer ends of the spokes may extend into the resonator adjacent the interior nodal points to reduce mechanical losses to the substrate.

The device may further include a drive electrode structure adjacent the resonator for driving the resonator so that the resonator changes shape at resonance.

The resonator may be an extensional mode device having a compound mode that involves both radial and tangential displacement.

The resonator may be a hollowed-out disk resonator, or a ring resonator.

The spokes may have inner and outer ends and the ring resonator may have an inner periphery. Interfaces between the outer ends and the inner periphery may be acoustically matched.

The non-invasive support structure may force the resonator to vibrate in the desired mode shape while suppressing any undesired mode shapes.

The desired mode shape may be a contour mode shape.

The device may further include a drive electrode structure formed on the substrate at a position to allow electrostatic excitation of the resonator so that the resonator is driven in the desired mode shape. The resonator and the drive electrode structure may define a capacitive gap therebetween.

The drive electrode structure may be disposed with the central cavity of the resonator.

The capacitive gap may be a sub-micron, lateral, capacitive gap.

The drive electrode structure may include a plurality of split electrodes.

The support structure may include a single anchor positioned within the central cavity of the resonator.

The device may further include a sense electrode structure formed on the substrate at a position to sense output current based on motion of the resonator.

The drive electrode structure may include a plurality of separate input drive electrodes and the sense electrode structure may include a plurality of separate output sense electrodes.

The device may be silicon-based or may be a composite material having high acoustic velocity.

The spokes may have inner and outer ends, and the outer ends of the spokes may extend into the resonator adjacent the interior nodal points to reduce mechanical losses to the substrate.

The resonator may be a ring resonator having inner and outer peripheries. The drive electrode structure may include an inner set of electrodes disposed about the inner periphery between the spokes.

The desired mode shape may be a compound mode shape such as a wine-glass mode shape.

The compound mode may be a wine-glass mode.

The desired mode shape may be a wine-glass ring mode shape.

Further in carrying out the above object and other objects of the present invention, a micromechanical resonator device having a desired mode shape is provided. The device includes a substrate and a resonator having a stationary surface area. The desired mode shape is characterized by a plurality of interior nodal points located within the interior of the resonator. The desired mode shape involves movement of only a fraction of the stationary surface area at resonance. A non-intrusive support structure is anchored to the substrate to support the resonator above the substrate. Portions of the support structure extend into the resonator adjacent the interior nodal points to reduce mechanical losses to the substrate.

The portions of the support structure may include spokes, and the resonator may have a desired resonance frequency. The spokes may have a length based on the desired resonance frequency to reduce mechanical losses to the substrate.

The spokes may have inner and outer ends. The outer ends of the spokes may extend into the resonator adjacent the interior nodal points to reduce mechanical losses to the substrate.

The device may further include a drive electrode structure adjacent the resonator for driving the resonator so that the resonator changes shape at resonance.

The resonator may be an extensional mode device having a compound mode that involves both radial and tangential displacement.

The resonator may be a hollowed-out disk resonator or a ring resonator.

Portions of the support structure may comprise spokes having inner and outer ends. The ring resonator may have an inner periphery. Interfaces between the outer ends and the inner periphery may be acoustically matched.

The non-invasive support structure may force the resonator to vibrate in the desired mode shape while suppressing any undesired mode shapes.

The desired mode shape may be a contour mode shape.

The device may further include a drive electrode structure formed on the substrate at a position to allow electrostatic excitation of the resonator so that the resonator is driven in the desired mode shape. The resonator and the drive electrode structure may define a capacitive gap therebetween.

The drive electrode structure may be disposed with a central cavity of the resonator.

The capacitive gap may be a sub-micron, lateral, capacitive gap.

The drive electrode structure may include a plurality of split electrodes.

The resonator may include a central cavity, and the support structure may include a single anchor positioned within the central cavity of the resonator.

The device may further include a sense electrode structure formed on the substrate at a position to sense output current based on motion of the resonator.

The drive electrode structure may include a plurality of separate input drive electrodes and the sense electrode structure may include a plurality of separate output sense electrodes.

The device may be silicon-based or may be a composite material having high acoustic velocity.

Portions of the support structure may include spokes using inner and outer ends. The outer ends of the spokes may extend into the resonator adjacent the interior nodal points to reduce mechanical losses to the substrate.

The resonator may be a ring resonator having inner and outer peripheries. The drive electrode structure may include an inner set of electrodes disposed about the inner periphery.

The desired mode shape may be a compound mode shape such as a wine-glass mode shape.

The compound mode may be a wine-glass mode.

The desired mode shape may be a wine-glass ring mode shape.

Still further in carrying out the above object and other objects of the present invention, a filter is provided which includes a substrate and a plurality of resonators. Each of the resonators has a desired mode shape and a stationary surface area. The desired mode shape is characterized by a plurality of interior nodal points located within the interior of the resonator. The desired mode shape involves movement of only a fraction of the stationary surface area at resonance. The filter further includes a plurality of non-intrusive support structures. Each of the support structures is anchored to the substrate to support its respective resonator above the substrate. Portions of each support structure extend into its respective resonator adjacent the interior nodal points to reduce mechanical losses to the substrate. The filter further includes a mechanism for coupling the resonators together to form the filter.

Yet still further in carrying out the above object and other objects of the present invention, a filter is provided which includes a substrate and a plurality of hollow resonators. Each of the resonators has a desired mode shape, a central cavity and a stationary surface area. The desired mode shape is characterized by a plurality of interior nodal points located between the cavity and an outer periphery of its resonator. The desired mode shape involves movement of only a fraction of the stationary surface area at resonance. The filter further includes a plurality of non-intrusive support structures. Each of the support structures is anchored to the substrate and includes a hub disposed within its respective cavity and a plurality of spokes which radiate from the hub and support its respective resonator above the substrate to reduce mechanical losses to the substrate. The filter further includes a mechanism for coupling the resonators together to form the filter.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 1a is a perspective schematic view of one embodiment of a micromechanical "hollow-disk" ring resonator in a typical two-port bias and excitation configuration with an equivalent LCR circuit model and quarter-wavelength supporting beam;

FIG. 1b is a perspective schematic view of the resonator of FIG. 1a illustrating direct support attachments;

FIG. 1c is a perspective schematic view of the resonator of FIG. 1a illustrating notched support attachments;

FIGS. 2a and 2b illustrate finite element simulated modes for the hollow-disk ring resonator and longitudinal supporting beam of FIG. 1b; in particular, FIG. 2a illustrates a $1^{st}$ contour mode (symmetric); FIG. 2b illustrates a $2^{nd}$ contour mode (anti-symmetric);

FIG. 6a is a schematic perspective view of a two-resonator micromechanical "hollow-disk" ring filter with low-velocity coupling in a two-port measurement scheme;

FIG. 6b illustrates an equivalent mechanical circuit to the ring filter of FIG. 6a;

FIGS. 7a, 7b and 7c illustrate models of the extensional coupling spring; FIG. 7a shows an extensional-mode beam with physical dimensions; FIG. 7b shows a generalized T-network with impedances; FIG. 7c shows a quarter-wavelength coupling network;

FIG. 8 illustrates a theoretically and finite element simulated mode shape for one embodiment of the micromechanical "hollow-disk" ring resonator with expressions for coupling locations;

FIGS. 9a and 9b illustrate finite element simulated mode shapes for the micromechanical "hollow-disk" ring filter; FIG. 9a shows the out-of-phase mode; FIG. 9b shows the in-phase mode;

DETAILED DESCRIPTION OF THE PREFERRED EMBODIMENTS

One embodiment of the present invention provides a radial ring resonator that uses a centralized support structure and notching at the support attachment locations that together greatly reduce support losses and allow polysilicon ring resonator Q's in excess of 10,000 at frequencies past 1 GHz. The specific design, shown in FIG. 1(a), is dubbed the "hollow-disk" ring resonator, since it is obtained by removing quadrants of material from a solid disk resonator [8], but purposely leaving intact beams or spokes of material to non-intrusively support the ring structure.

The hollow resonator has a central cavity in which a hub of material is disposed and supported on a stem. The beams or spokes radiate from the hub at their inner ends and support the resonator above the substrate at their outer ends.

Using an un-notched version of this design (i.e., FIG. 1b), several vibration modes have been demonstrated spanning frequencies from HF (24.4 MHZ), to VHF (72.1 MHZ), to UHF (1.169 GHz), with Q's as high as 67,519, 48,048, and 5,846, respectively.

With notched support attachments as depicted in FIG. 1(c), the outer ends of the beams or spokes extend into the resonator adjacent interior nodal points of a nodal circle. A Q of 14,603 has been achieved at 1.2 GHz, which represents the highest Q measured to date for any on-chip resonator past 1 GHz at room temperature, and which is now high enough to make possible RF channel-select filters with losses less than 1 dB.

With electrodes both inside and outside the disk ring structure, this design attains electrode overlap advantages similar to that of a previously published annular ring design [9], while offering a much less intrusive support structure that not only enables substantially higher Q, but also enables impedances as low as 282 kΩ, which is 12×smaller than achieved by previous surface-micromachined, pure polysilicon, solid disk resonators operating past 1 GHz [8]. The design and fabrication principles that allow this hollow-disk ring to achieve frequencies and Q's suitable for use in RF channel-select filters are described in detail hereinbelow.

Maximizing Resonator Q

One of the keys to attaining the exceptionally high Q at RF is in the non-intrusive suspension design, shown in FIG. 1(b). Here, the use of a centrally-located anchor with longitudinal-mode, quarter-wavelength, radial support beams provides a degree of balance and isolation that greatly suppresses anchor losses to the substrate, allowing this annular ring-type resonator to achieve Q's much higher than versions where the ring is directly anchored to the substrate from underneath [9].

Figure 2C:
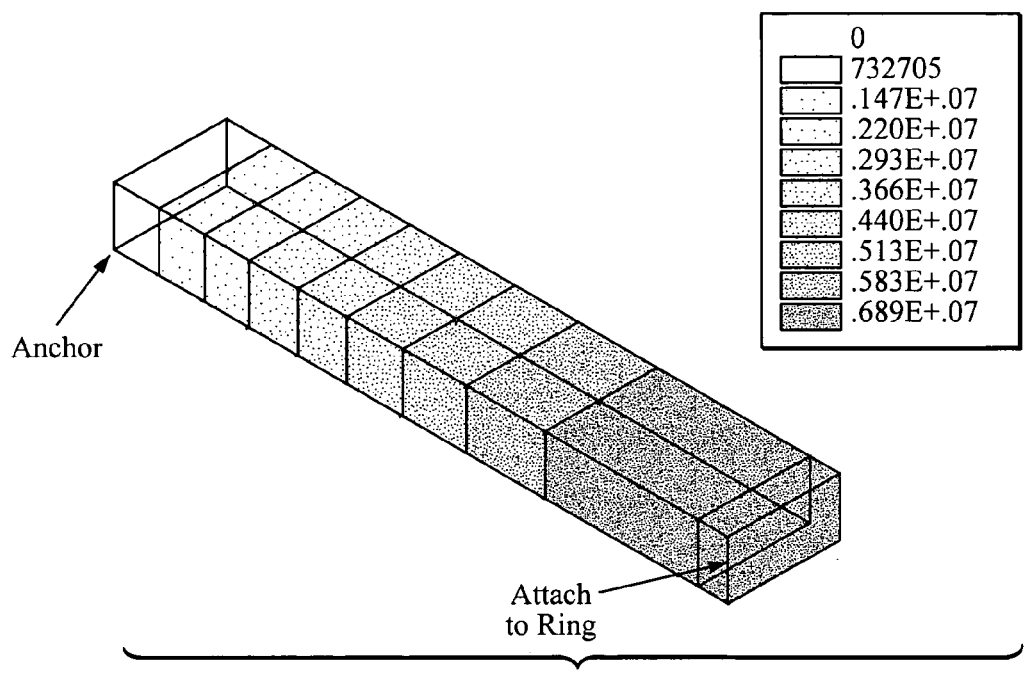
FIG. 2c illustrates a longitudinally vibrational mode shape of a $\lambda/4$ supporting beam at the ring's resonance frequency.

From the mechanical point of view, the supporting beams with quarter-wavelength design in FIG. 2(c) exactly perform the longitudinal vibration modes in a clamped-free boundary condition at desired resonance frequency. In other words, one end of the support beam is fixed at the central stem of a given ring structure while the other is attached to the inner surface of the vibrating ring and provides a free boundary condition to the ring exactly at ring's resonance frequency as shown in FIG. 1(a). By doing so, the ring ideally cannot see the obstructions of the supporting beams. From the acoustic viewpoint, the interface between the ring's inner surface and the attached portion of the supporting beam are acoustically matched and effectively creates acoustic impedance-mismatches between the ring resonator and its distant anchors, which gives this vibrating structure the minimum energy loss to attain very high Q.

In particular, although locating anchors at nodal points—as done in [8],[9] and some versions of [10]—does reduce energy transfer from a vibrating resonator to its anchors by virtue of the very little (ideally no) motion occurring at the nodes, some energy is still lost since the anchors are inevitably finite in size, and thus, still attach to non-nodal (i.e., moving) locations immediately around the nodal points. If the resonator and anchor materials are identical, then direct attachment of the anchor (or stem) to the resonator constitutes a nearly perfect impedance match (i.e., a perfect energy transfer path) at the resonator-anchor interface [11], and this only exacerbates the loss issues. On the other hand, the use of quarter-wavelength support beam suspensions as shown in FIG. 1(b) effectively creates acoustic impedance-mismatches between the ring resonator and its distant anchors, which reflect wave energy back into the ring structure, minimizing energy losses, and maximizing the system Q. The balanced suspension used in FIG. 1(b) offers the additional advantage of allowing symmetric, as well as anti-symmetric, contour modes, as shown in the ANSYS simulations of FIGS. 2a and 2b. The availability of both symmetric and anti-symmetric modes allows this device to invert the input-to-output phase difference of the resonator, which, in turn, facilitates the implementation of parallel filters [12] and mechanically-coupled arrays [13] for higher power handling ability and even lower impedance.

In addition to quarter-wavelength supports, the design of FIG. 1(c) goes one step further to reduce loss in the support structure of FIG. 1(b) by using notched ring attachment points that allow support beams to attach to the ring resonator structure closer to its actual nodal points. This further reduces acoustic losses through the support beams, allowing this annular ring-type resonator to achieve impressive Q's in excess of 10,000 at UHF.

Device Operation and Design

FIG. 1(a) shows a ring with external radius $r_i$, internal radius $r_o$, and thickness H; for the analysis, cylindrical coordinates r, z, and θ, with origin in the center of the ring are used [14]. The ring is supposed to be thin: $H \ll r_i$. The major faces of the ring are supposed stress free, i.e., $T_{zz}$, $T_{z\theta}$, and $T_{zr}$, vanish on these surfaces; since the ring is thin, they are also assumed to vanish throughout. Assuming axial-symmetry, i.e., $\partial u_r/\partial \theta = 0$, and $\partial u_\theta = 0$, the constitutive equations for a ring can be reduced to $$T_{rr} = c_{11}^E \frac{\partial u_r}{\partial r} + c_{12}^E \frac{u_r}{r} \tag{1a}$$

$$T_{\theta\theta} = c_{12}^E \frac{\partial u_r}{\partial r} + c_{11}^E \frac{u_r}{r} \tag{1b}$$

$$T_{r\theta} = 0 \tag{1c}$$

The wave differential equation describing the element vibration in the radial direction is:

$$\frac{\partial T_{rr}}{\partial r} + \frac{T_{rr} T_{\theta\theta}}{r} = \rho \ddot{u}_r \tag{2}$$

And substituting the stress components (1a) and (1b) in (2), it becomes:

$$c_{11}^E \left[ \frac{\partial^2 u_r}{\partial r^2} + \frac{\partial u_r/\partial r}{r} - \frac{u_r}{r^2} \right] = \rho \ddot{u}_r \tag{3}$$

Assuming that the ring is driven by an AC voltage $V = V_0 e^{j\omega t}$, it follows that:

$$\frac{\partial^2 U_r}{\partial r^2} + \frac{\partial U_r/\partial r}{r} + \left[ \frac{\omega^2}{(v^P)^2} - \frac{1}{r^2} \right] U_r = 0 \tag{4}$$

where $$v^P = \sqrt{\frac{c_{11}^E}{\rho}}$$

is acoustic velocity.

The general equation of (4) is:

$$U_r = [AJ_1(hr) + BY_1(hr)] e^{j\omega t} \tag{5}$$

where $h = \omega/v^P$ is frequency parameter, $J_1$ is the Bessel function of first kind and first order, and $Y_1$ is the Bessel function of second kind and first order. For a solid disk, the radial component of the motion at the original is zero, so that in (5) B=0 must be imposed to avoid a singularity at the origin and this formation is exactly the same with the solid disk derivation in [8]. In this ring case, the origin does not belong to the defined domain and therefore the complete (5) must be used.

The constants A and B can be computed satisfying the stress-free boundary conditions:

$$T_{rr} = 0 \text{ at } r = r_i \text{ and } r = r_o. \tag{6}$$

Combining (5), (1a), and (6), the constant ratio $$\frac{B}{A} = -\frac{r_i F_J(r_o) - r_o F_J(r_i)}{r_i F_Y(r_o) - r_o F_Y(r_i)} \quad (7)$$

where $$F_J(r) = hrJ_0(hr) - J_1(hr)(1-\sigma) \quad (8)$$

$$F_Y(r) = hrY_0(hr) - Y_1(hr)(1-\sigma) \quad (9)$$

And $\sigma = c_{12}^E/E_{11}^E$ can be interpreted as a planar Poisson's ratio, since the material of polysilicon is isotropic in the plane normal to the z axis.

The frequency equation obtained from (5) and (6) is:

$$[J_1(hr_i)\sigma - J_1(hr_i) + r_i hJ_0(hr_i)] \times [Y_1(hr_o)\sigma - Y_1(hr_o + r_o hY_0(hr_o)]$$

$$-[Y_1(hr_i)\sigma - Y_1(hr_i) + r_i hY_0(hr_i)] \times [J_1(hr_o)\sigma - J_1(hr_o) + r_o hJ_0(hr_o)] = 0. \quad (10)$$

Figure 3:
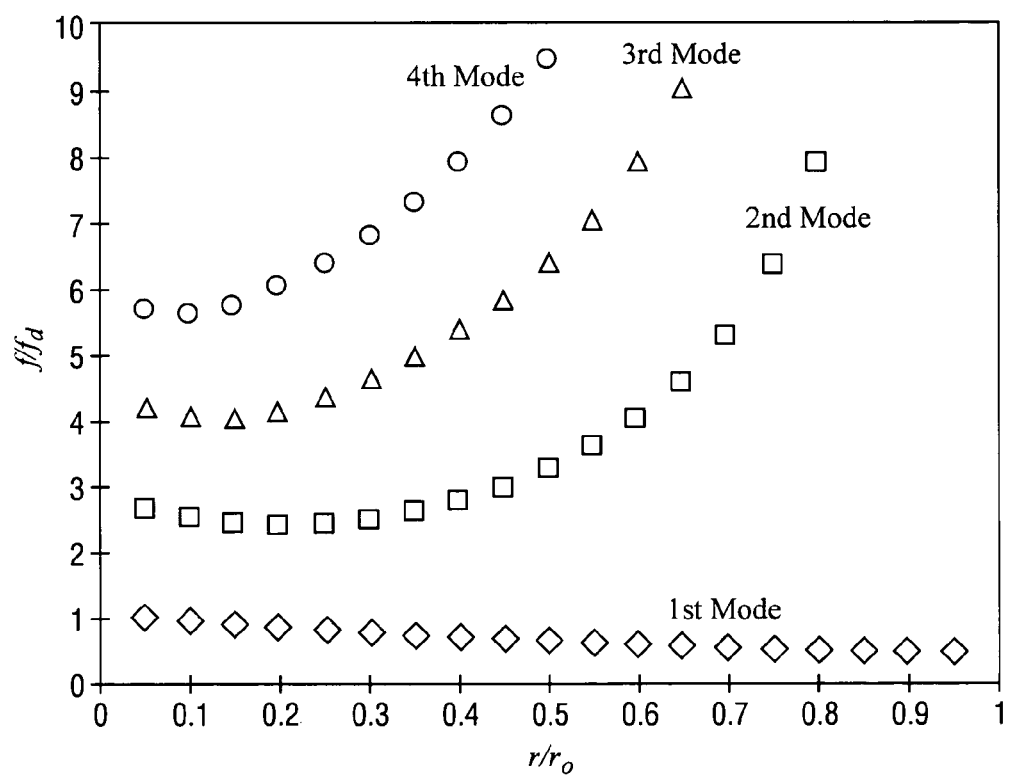
FIG. 3 is a graph which illustrates a frequency spectra for a ring with $r_o$=20 μm and variable $r_i$ in its $1^{st}$, $2^{nd}$, $3^{rd}$, and $4^{th}$ modes; $f_d$ is the fundamental resonance frequency of a solid disk with radius $r_0$.
Figure 4A:
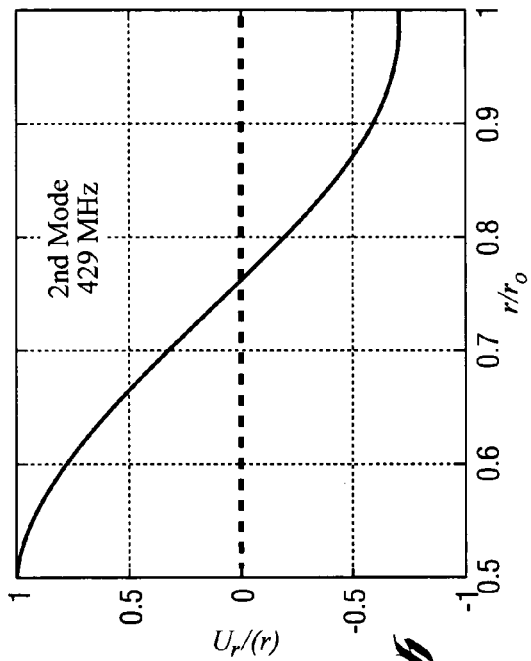
FIGS. 4a, 4b, 4c and 4d are graphs which illustrate first, second, third, and fourth mode shapes, respectively, for a "hollow-disk" ring with $r_i/r_o$=0.5, $r_o$=20 μm; their associated resonance frequencies are also included.
Figure 4B:
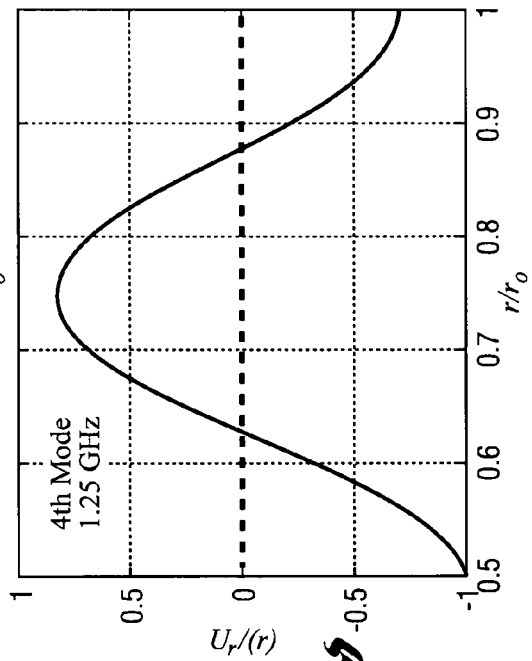
Figure 4C:
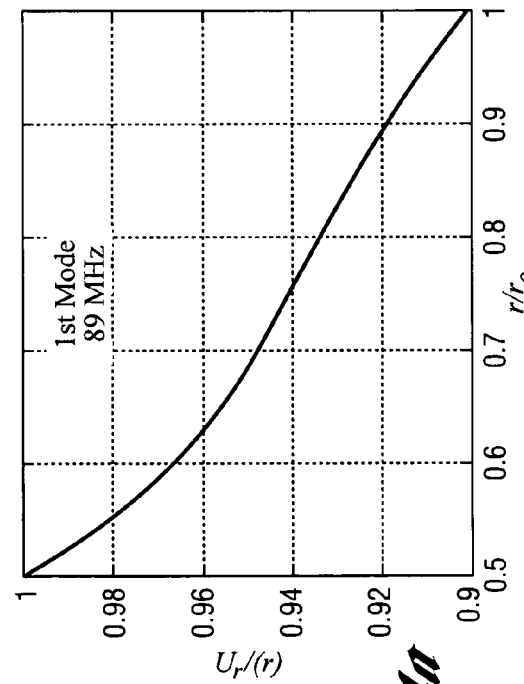
Figure 4D:
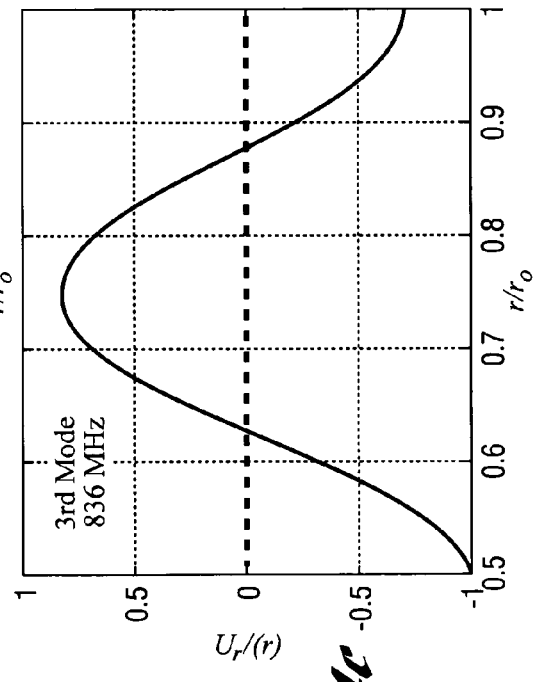

To analyze the dynamic behavior of the ring, its frequency spectrum was computed, varying the ratio $r_i/r_o$ from zero to one. FIG. 3 shows the resonance frequencies for a ring with $r_o$=20 µm. Some interesting observations can be made regarding the shape of the spectrum: when $r_i/r_o$ increases from zero to one, the first mode resonance frequency decreases, while the others reach a minimum and then quickly increase to infinitely. Two groups of resonance modes can therefore be defined: the first group to which only the first mode belongs and the second group which includes all the higher modes. Since these two groups have different trends, they should be related to different physical dimensions. The second group should be related to the radius of the annulus ($r_o$–$r_i$) which decreases as $r_i/r_o$ increases, while the first group should be related to the average radius of the ring which increases with $r_i/r_o$. In FIG. 3, it can also be observed that, as expected, when $r_i/r_o \rightarrow 0$, the resonance frequencies of the different modes approach those of a thin solid disk with the same radius, because the ring degenerates into a plate. Further, the ring approximates a lumped mode system when $r_i/r_o$ is close to one. The radial displacements for the fundamental, second, third, and forth modes are simulated in FIGS. 4a, 4b, 4c and 4d, respectively. It can be seen that, as expected, for the second and forth modes, the inner and outer lateral surfaces of the ring move in opposite directions, while for the first and third modes, the surfaces move in the same direction. In this work, the higher modes of a ring are used to take advantage of keeping the reasonable size not only in order to attain low motional resistance and maintain power handling capability but also go towards GHz frequency operation.

Pursuant to specifying the operation mode of these devices, FIG. 1a presents a clear perspective-view schematic of the "hollow disk" ring, indicating key features, and specifying the required electrical input and output configuration for capacitively transduced operation. As shown, under normal operation, the mechanical structure should be charged, in this case via DC-bias voltage $V_P$ (from which no DC current flows once the conductive structure is charged, so there is no DC power consumption). Alternatively, a charge can be placed on the structure itself (e.g., by implantation) to effectively realize an electret that obviates the need for a voltage source. The voltage, $V_P$, generated by the charge effectively amplifies both the force imposed by the AC excitation signal, $v_i$, and the output motional current, $i_o$, generated by the DC-biased, time-varying, electrode-to-resonator capacitor that results when the ring vibrates. The transfer function from input to short-circuited output can be expressed as:

$$\frac{i_o}{v_i} = \frac{1}{R_x} \frac{(\omega_o/Q)}{s^2 + (\omega_o/Q)s + \omega_o^2} \quad (11)$$

where $\omega_o$ is its radian resonance frequency, and $R_x$ is the series motional resistance of the device. Recognizing (11) as the transfer function for a classic bandpass biquad, the micromechanical resonator of FIG. 1a, and virtually all two-port vibrating mechanical resonators, can be modeled by the equivalent LCR electrical circuit shown in FIG. 1a.

More specifically, to excite this device in its two-port configuration (shown in FIG. 1(a)), a DC-bias voltage $V_P$ is applied to the ring, and an AC signal, $v_i$, to its inner electrodes, generating an electrostatic force acting radially on the ring at the frequency of the AC input. When the frequency of $v_i$ matches one of the ring's mode frequencies, the resulting force drives the ring into the corresponding vibration mode shape. For example, in the anti-symmetric mode of FIG. 2(b), the ring expands and contracts along its inner and outer perimeters. This motion creates a DC-biased (by $V_P$) time-varying capacitance between the ring and output electrode that then sources an output current, $i_o$ proportional to the amplitude of vibration. In effect, electrical input signals are converted to mechanical signals, processed (with high Q) in the mechanical domain, then re-converted to electrical signals at the output, ready for further processing by subsequent transceiver stages. Electrically, this mechanical resonator device is equivalent to the LCR tank circuit shown in FIG. 1(a).

As indicated in FIG. 1(a), the vibrational resonance frequency is governed by the ring structure, which vibrates in contour mode shapes like those shown in FIGS. 2a and 2b. The use of a non-intrusive, centrally-anchored support in this device forces a sequenced design procedure, where the support structure must be designed first. The design sequence is such that the length of the radial support beams, $L_S$, is first set to correspond to one or more quarter-wavelengths at the desired resonance frequency, $f_o$, using the expression:

$$L_S = \frac{n\sqrt{E/\rho}}{4f_0}, n = 1, 3, 5 \ldots \quad (12)$$

where E and ρ are the Young's modulus and density, respectively, of the structural material, and n is the odd number of multiple quarter-wavelengths. The value of $L_S$ then sets the inner radius of the ring $r_i$; i.e., $r_i = L_S$. The outer radius $r_o$, can now be determined by solving the expression (10) where $L_S$, $r_i$, and $r_o$ are indicated in FIG. 1(a); σ is the Poisson ratio of the structural material; h is a frequency parameter; and $J_0$ ($J_1$), and $Y_0$ ($Y_1$) are Bessel functions of the first and second kinds, respectively. For a ring with $r_i$=11.8 mm and $r_o$=18.7 µm, (10) yields a resonance frequency of 1.206 GHz.

It should be noted from (10) that the frequency of this device is independent of thickness to first order, so the designed frequency is relatively insensitive to process variations in thickness. As such, filters at many different frequencies, such as required by multi-band and RF channel-select applications, can be achieved in a single fabrication run, with one structural film deposition. This is a distinct advantage over most piezoelectric counterparts (e.g., FBARs, crystals) for which frequency is often determined primarily by thickness, making it difficult to manufacture several different multi-band frequencies on the same chip without the need for several structural film depositions, one for each frequency.

Series Motional Resistance

By using the one-port measurement set-up where input voltage is applied to both inner and outer electrodes and the output current is sourced out from the structure via bias-Tee, the total output current can be expressed by the superposition of the inner and outer transducing as:

$$i_o = \frac{dq_{inner}}{dt} + \frac{dq_{outer}}{dt} \quad (13)$$

After the Laplace transform in order to focus on the amplitude of all time-dependent variables, $$I_o = s(Q_{inner} + Q_{outer}) = j\omega(\eta_{inner}X_{inner} + \eta_{outer}X_{outer}) \quad (14)$$

where $s=j\omega$ is the Laplace parameter and Q denotes the electrical charge only in this equation. The most important concept of the mode displacements expressed in (14) is that the total displacement in the inner surface of a ring can be regarded as the superposition of electrostatically induced motion from inner and outer electrodes. So the displacement of inner surface can be calculated as:

$$X_{inner} = \frac{QF_{inner}}{k_{inner}} + \frac{QF_{inner}}{k_{outer}}\left|\frac{X_{inner}}{X_{outer}}\right| \quad (15a)$$

The displacement of inner surface results from not only the inner electrostatic force but also the outer electrostatic force. However, the outer displacement determined by the outer electrostatic force needs to be scaled by the mode shape ratio between the inner and outer positions, and then can contribute to the correct displacement into the inner surface. So is the displacement of the outer surface which is:

$$X_{outer} = \frac{QF_{outer}}{k_{outer}} + \frac{QF_{inner}}{k_{inner}}\left|\frac{X_{outer}}{X_{inner}}\right| \quad (15b)$$

Based on the definition of electromechanical coupling coefficient, $$F_{inner} = \eta_{inner} v_i \quad (16a)$$

$$F_{outer} = \eta_{outer} v_i \quad (16b)$$

After the manipulation and some arrangements, the output current is on the form of:

$$I_o = j\omega Q\left(\frac{\eta_{inner}^2}{k_{inner}} + \frac{\eta_{inner}\eta_{outer}}{k_{outer}}\left|\frac{X_{inner}}{X_{outer}}\right| + \frac{\eta_{outer}^2}{k_{outer}} + \frac{\eta_{inner}\eta_{outer}}{k_{inner}}\left|\frac{X_{outer}}{X_{inner}}\right|\right) v_i \quad (17)$$

The motional resistance is defined as the ratio of input voltage and output current presenting $$R_x = \frac{v_i}{I_o} \quad (18)$$

$$= \frac{1}{j\omega Q\left(\frac{\eta_{inner}^2}{k_{inner}} + \frac{\eta_{inner}\eta_{outer}}{k_{outer}}\left|\frac{X_{inner}}{X_{outer}}\right| + \frac{\eta_{outer}^2}{k_{outer}} + \frac{\eta_{inner}\eta_{outer}}{k_{inner}}\left|\frac{X_{outer}}{X_{inner}}\right|\right)}$$

where $\eta_{inner} = V_P \frac{\partial C_i}{\partial d} = V_P \frac{\varepsilon_o 2\pi r_i H}{d_0^2}$ and $\eta_{inner} = V_P \frac{\partial C_o}{\partial d} = V_P \frac{\varepsilon_o 2\pi r_0 H}{d_0^2}$.

Assuming the radius of the ring is large enough and $r_i \sim r_o$, the motion resistance can be reduced to a more intuitive form as:

$$R_x \approx \frac{1}{j\omega Q(4\eta^2/k)} = \frac{kd_0^4}{4\omega Q\varepsilon_0^2(2\pi r_o H)^2} \quad (19)$$

That's because the coupling coefficient, $\eta$, and stiffness constant, k, of the inner and outer surfaces of the ring are almost the same. According to (19), obtaining smaller motional resistance, the best strategy is to reduce the electrode-to-resonator gap spacing or enlarge the overlap area by increasing the radius of the ring.

Having covered the derivation of the one-port motional resistance, the two-port set-up is depicted in FIG. 1(a). The output current is solely sourced from the sensing electrode and can be expressed as:

$$i_o = \frac{dq_{sense}}{dt} \quad (20)$$

As (4), the magnitude of the output current can be presented as:

$$I_{out} = j\omega \eta_{sense} X_{sense} \quad (21)$$

In order to transform (21) into the driving part, the relation below is needed:

$$X_{sense} = \left(\frac{X_{sense}}{X_{drive}}\right) X_{sense} \quad (22)$$

At resonance, the mode displacement is amplified by quality factor Q and becomes:

$$X_{drive} = \frac{QF_{drive}}{k_{drive}} \quad (23)$$

As (16), the electrostatic force is expressed as:

$$F_{drive} = \eta_{drive} v_i \quad (24)$$

After the manipulation and some arrangements, the magnitude of output current becomes:

$$I_o = j\omega \left| \frac{X_{sense}}{X_{drive}} \right| \left( \frac{Q\eta_{drive}\eta_{sense}}{k_{drive}} \right) v_i \quad (25)$$

Then, motional resistance can be obtained as $$R_x = \frac{v_i}{I_o} = \frac{1}{j\omega \left| \frac{X_{sense}}{X_{drive}} \right| \left( \frac{Q\eta_{drive}\eta_{sense}}{k_{drive}} \right)} \quad (26)$$

The same procedure as (19), the more intuitive form the two-port motional resistance becomes:

$$R_x \approx \frac{1}{j\omega Q(\eta^2/k)} = \frac{kd_0^4}{\omega Q \varepsilon_0^2 (2\pi rH)^2} \quad (27)$$

Compared to (19), the two-port $R_x$ is around four times larger than one port $R_x$.

The series motional resistance, $R_x$, is perhaps the most important of the elements in the equivalent circuit of FIG. 1(a), since it often governs the impedance matching and gain requirements for filters and oscillators, respectively, using this resonator. The $R_x$ for the present device can be obtained by obtaining an expression for shunted output current, $i_o$, as a function of input drive voltage, $v_i$, using a procedure similar to (26), then applying $R_x = v_i/i_o$. Doing so for the present device yields:

$$R_x = \frac{v_i}{i_o} = \frac{k_r(r_i)}{j\omega_o \left( \frac{X(r_o)}{X(r_i)} \right) Q\eta(r_i)\eta(r_o)} \quad (28)$$

where $X(r)$ is the peak vibration displacement amplitude at radius r, $\omega_o$ is the angular resonance frequency, and where $$\eta(r) = V_P \frac{\partial C}{\partial r} = V_P \frac{2\pi\varepsilon_0 rH}{d_0^2} \quad (29)$$

$$k_r(r) = \omega_o^2 \frac{\int_{r_i}^{r_o} 2\pi\rho HX^2(r)dr}{X^2(r)} \quad (30)$$

where $\varepsilon_0$ is the permittivity in vacuum; r and H are the radius and thickness, respectively, of the ring; $d_0$ is the electrode-to-resonator gap spacing; and $V_P$ is the DC-bias voltage.

For a ring with $r_i$=11.8 μm, $r_o$=18.7 μm, $d_0$=100 nm, Q=15,000, and a DC-bias voltage $V_P$ of 10V, (28) yields $R_x$=274 k Ω. Even lower values of $R_x$ can be achieved with higher values of $V_P$. For example, a $V_P$ of 100V would yield an $R_x$ of 2.7 k Ω. Table 1 illustrates the wide range of series motional resistances $R_x$ achievable by rings with various characteristics, illustrating the importance of structural radii, $r_i$ ($r_o$), gap spacing, $d_0$, bias voltage, $V_P$, and quality factor, Q.

TABLE 1

Series motional resistances $R_x$ achievable by 3$^{rd}$ mode hollow-disk rings at 1.2 GHz with various characteristics.

| Parameter | (a) | (b) | (c) | (d) | (e) | Units |
|---|---|---|---|---|---|---|
| $r_i$ | 11.8 | 146 | 11.8 | 11.8 | 11.8 | μm |
| $r_o$ | 18.7 | 153 | 18.7 | 18.7 | 18.7 | |
| $d_0$ | 100 | 100 | 50 | 100 | 100 | nm |
| $V_P$ | 10 | 10 | 10 | 100 | 10 | V |
| Q | 15,000 | 15,000 | 15,000 | 15,000 | 1,000 | — |
| $R_x$(2P) | 274.4 | 27.1 | 17.1 | 2.7 | 4115.6 | kΩ |

(a) Standard case.
(b) Large electrode overlap area.
(c) Small gap spacing.
(d) Large bias voltage.
(e) Small Q.

Of these "$R_x$-control parameters," the first based on scaling of the average ring radius is unique to ring resonator design, as previously pointed out in [9]. In particular, since the frequency of a ring (given by (10)) is dependent mainly on its width ($r_o-r_i$), and relatively independent of its average radius, a ring is capable of achieving a specified frequency with any value of average radius. Thus, for any given frequency, the radius of a ring can be chosen as large as necessary to achieve an electrode-to-resonator overlap capacitance that yields a desired value of $R_x$. (In doing so, the support structure will need to set at multiple quarter-wavelengths, e.g., 3λ/4, 5λ/4, etc., in order to preserve anchor isolation.)

The ability to do this is especially useful in applications where $V_P$ is limited, or where the electrode-to-resonator gap spacing cannot be decreased, perhaps due to linearity constraints [16]. However, $R_x$ reduction via radius scaling can be done only at the cost of die area. As illustrated by column (b) of Table 1, the ring radius must be increased by more than 10× to match the $R_x$ reduction attained by a mere halving in electrode-to-resonator gap spacing. In this respect, radius scaling of single rings may not be as effective for RX reduction as summing up the outputs of numerous smaller rings or solid disks, where even larger capacitive overlap areas should achievable in the same amount of die area, and where signal-to-noise advantages also come into play, since signals add directly, but noise only adds as power. The recent mechanically-coupled resonator array technique demonstrated in [13] might be ideal for this latter approach.

Fabrication

2 μm-thick, notched and un-notched (for comparative purposes), contour-mode hollow-disk ring resonators with 100 nm electrode-to-resonator gaps were fabricated via a three-polysilicon self-aligned-and-filled stem process used previously to achieve GHz frequency (but with lower Q) solid disk resonators [8]. Given the importance of stem alignment described in [8], the fabrication process is designed to eliminate the possibility of disk-to-stem misalignment, by removing the need for alignment. The present process defines both the stem position and structural edges all in one mask, effectively eliminating the possibility of misalignment.

FIGS. 5a through 5e present cross-sections that achieve self-aligned-stem "hollow-disk" ring resonators having: silicon substrate 50; $n^+$ layer 51; oxide layers 52, 53 and 54; nitride layer 55; polysilicon layers 56 and 57; and polysilicon structures 58, 59, 60, 61 and 62.

Figure 5A:
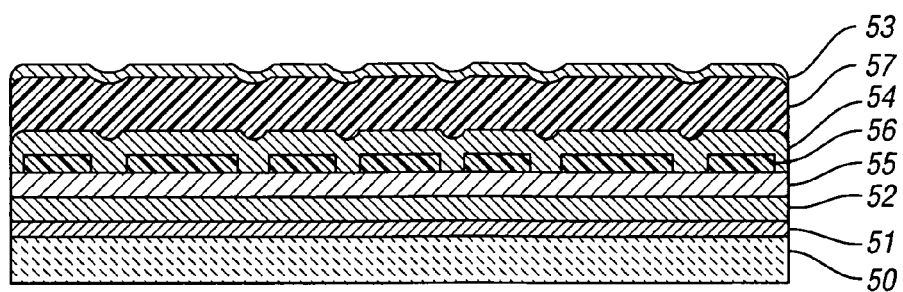
FIGS. 5a through 5e are cross-sectional views depicting the stem self-aligned fabrication sequence used to achieve the micromechanical "hollow-disk" ring resonantor constructed in accordance with one embodiment of the present invention.

The process starts with a heavy phosphorous diffusion to serve as the substrate ground plane 51. Then a 2 μm-thick oxide film 52 is first deposited over the $n^+$-doped substrate 50 and 51, followed by a 350 nm-thick film 55 of nitride. These two layers 52 and 55 together serve to isolate devices and interconnects from the conductive silicon substrate 50. Interconnect polysilicon 56 is then deposited to a thickness of 350 nm and doped. After patterning this polysilicon layer 56 to form ground planes and interconnects, 650 nm of oxide 54 is deposited to act as a sacrificial layer to temporarily support a subsequent structural polysilicon layer 57 as shown in FIG. 5(a) during its own deposition and patterning. The structural polysilicon film 57 is deposited 2 μm-thick, doped, and then capped with a 1.2 μm-thick film 53 of oxide that serves as both a hard mask during etching of the structural polysilicon film 57, and later as a spacer layer to separate the ring 60 from overhanging electrode portions 58 and 59.

Figure 5B:
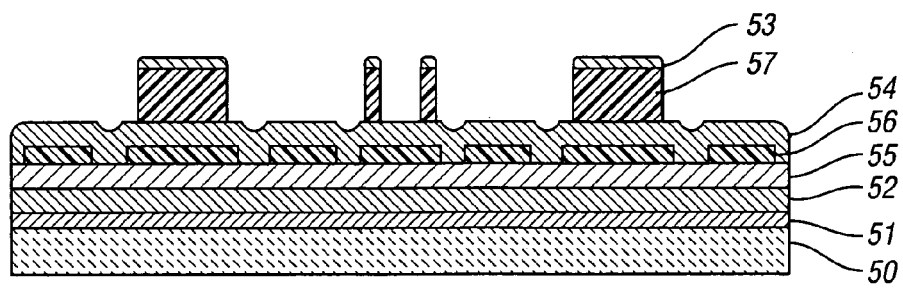

Then the composite oxide mask/polysilicon layer (53,57) is patterned in a single mask to define not only the ring structure 60, but also a 2 μm-diameter opening at its center that defines the eventual location of the central stem 61 (i.e., see FIG. 5e) as shown in FIG. 5(b).

Figure 5C:
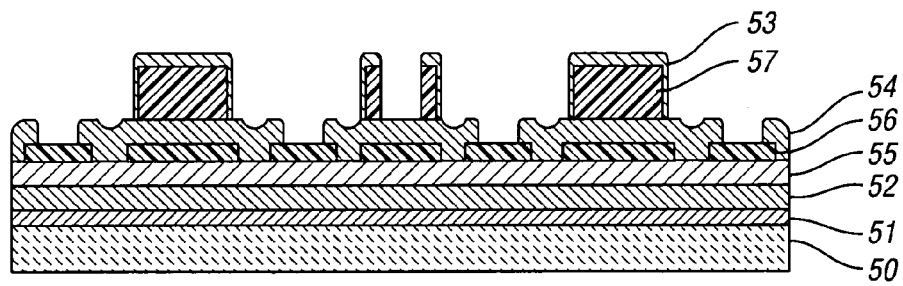

A 100 nm-thick sidewall sacrificial oxide 53 is then conformally deposited to define the eventual electrode-to-resonator capacitive gap spacing. Pursuant to eventual refilling of the stem opening, a thick photoresist is spun and patterned to expose the stem and the electrode vias, after which the sidewall sacrificial spacer oxide 53 is removed in the stem opening and the underlying bottom sacrificial oxide 54 etched down to the substrate as shown in FIG. 5(c).

Figure 5D:
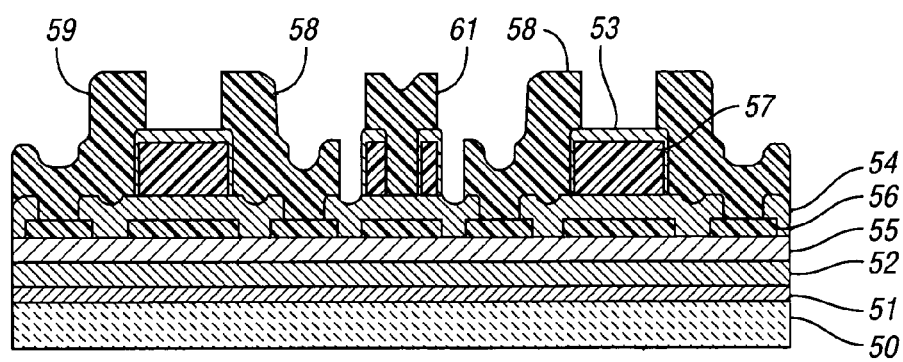

With exposed stem holes and electrode anchor vias, a subsequent (third) 2 μm polysilicon deposition then not only provides the material for the electrodes 58 and 59, but also refills the anchor vias to create very rigid, self-aligned stems 61. The third polysilicon layer is then doped and patterned as shown in FIG. 5(d).

Figure 5E:
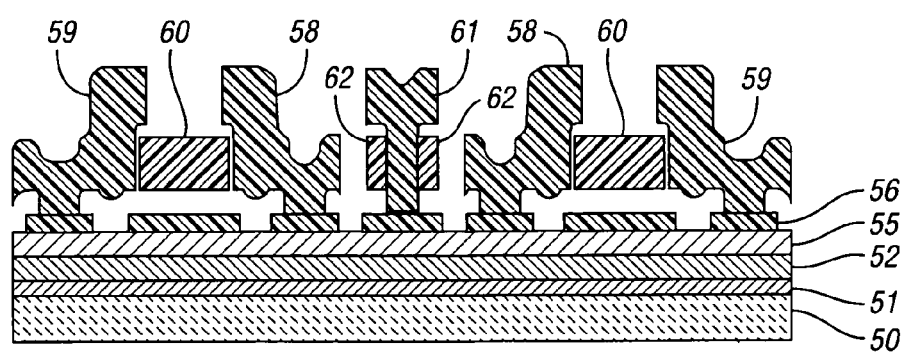

In the next step, the structures 58, 59, 60, 61 and 62 are released in HF to yield the final cross-section of FIG. 5(e). The structures include inner drive electrodes 58, outer sense electrodes 59, ring 60, stem 61 and beams 62.

Micromechanical "Hollow-Disk" Ring Filters

UHF vibrating micromechanical "hollow-disk" ring filters (FIG. 6a) comprised of mechanically coupled resonators with resonator Q's greater than 10,000 to achieve filter Q's on the order of thousands have been demonstrated for the first time in 431 MHZ using a polysilicon surface micromachining technology described above. These filters are achieved by coupled mechanical systems with a lumped mechanical circuit diagram similar to that of FIG. 6b, and with two modes of vibration that combined to form a filter passband. Physically, these filters are composed of two micromechanical hollow-disk ring resonators as described in previous section coupled by a longitudinal-mode mechanical spring. These constituent resonators supported by nonintrusively quarter-wavelength beams have already demonstrated, by using mixing measurement technique, the Q's greater than 10,000 in 430 MHZ in order to allow RF channel-select filters possible. This filter work especially takes advantage of high Q's and relatively low motional resistance of "hollow-disk" ring resonators to realize narrow-band filters with percent bandwidth less than 0.1% in UHF range.

The center frequency of a given filter is determined by the resonance frequency of the constituent resonators, while the bandwidth is set by the coupling spring dimensions and its attachment locations between the resonators [15]. For the purpose of filter design, FIG. 7a presents the coupling spring of FIG. 6a with the important dimensions labeled, and FIG. 7b shows a general transmission line model for the coupling beam, consisting of a T network of mechanical impedances. In micromechanical filters, the coupling spring and resonator dimensions are on the same order, and the spring mass can contribute considerably to the resonators, shifting the designed frequency. Quarter-wavelength coupling is important on this microscale to alleviate mass loading effects caused by similar resonator and coupler dimensions. Consequently, FIG. 7a presents a coupling network that meets the non-loading conditions of a quarter-wavelength spring and can be used in subsequent filter equivalent circuit. Despite constraints arising from quarter-wavelength design, a range of percent bandwidths is attainable by taking advantage of low-velocity attachment locations [15] as shown in FIG. 8. In order to attain greater filter Q, the dynamic spring constant of a hollow-disk ring is larger at locations close to the nodal circle depicted in FIG. 8, i.e., it is larger at points moving with lower velocity at resonance. By coupling the beams closer to the nodal circle, rather than at the outer periphery of ring resonators, narrower bandwidth can be achieved, even when the resonators and coupling springs have similar sizes. By utilizing the notched profile to reach low-velocity coupling locations, it's much easier to approach the nodal points in the ring resonator than the solid disk structure. On the other hand, the notched profile of rings has less impact on vibrational mode shape than that of disks.

As shown in FIGS. 9a and 9b, each mode peak of the filter response corresponds to a distinct, physical mode shape: in the low frequency mode, the resonators are 180° out of phase to keep coupler un-deformed; and in the higher frequency mode, both resonators vibrate in phase with compressive or extensional coupler.

Figure 10:
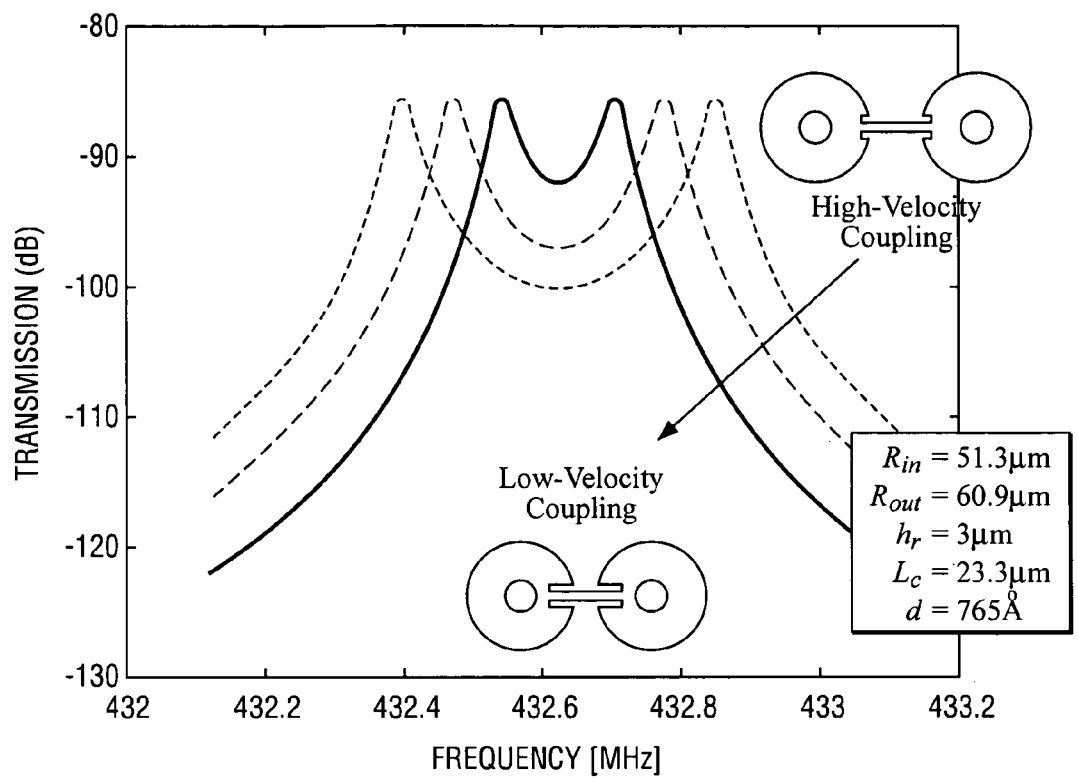
FIG. 10 is a graph of transmission versus frequency which illustrates simulated frequency response spectra for the equivalent lumped mechanical model of FIG. 6b with different coupling locations.

FIG. 10 presents the frequency spectra for the lumped mechanical model of FIG. 6a with different coupling locations. In these simulated spectra, the closer the attachment to the nodal circle is, the narrower the filter bandwidth. This section describes the design and fabrication principles that allow this hollow-disk ring filters to achieve frequencies and filter Q's suitable for use in RF channel selection.

Figure 11A:
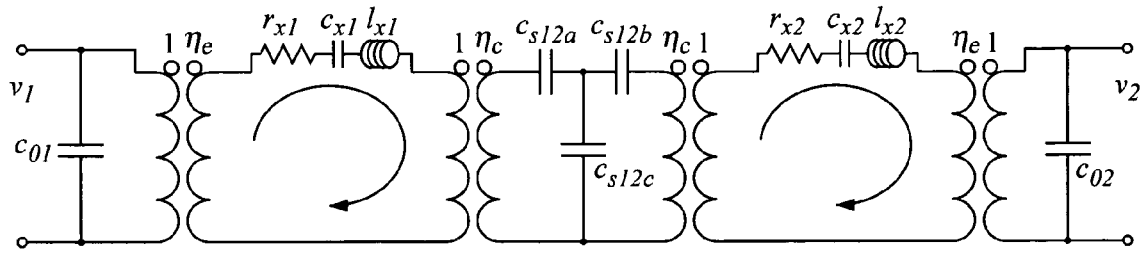
FIG. 11a illustrates complete equivalent circuit for the micromechanical filter of FIG. 6a, modeling both quarter-wavelength coupling beam and low-velocity coupling location.
Figure 11B:
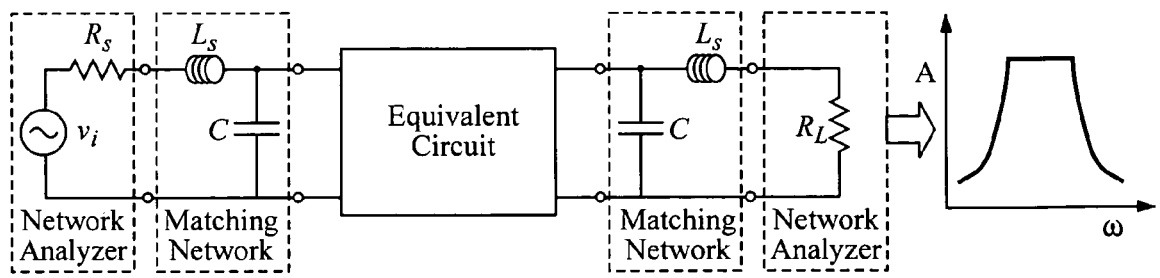
FIG. 11b shows a L-match network utilized to obtain a filter flat passband.

FIG. 11a presents a transformer-based equivalent circuit for the overall filter, where each resonator is modeled via electromechanical analogy. In order to obtain flat passband and low insertion loss, matching networks are necessary to provide impedance matching with properly termination in these filters as shown in FIG. 11b as a result of still large motional resistance of each hollow-disk ring resonator. Via the proper termination of matching network, the flat passband and insertion loss of only 2.6 dB can be achieved in SPICE simulation (using equivalent circuit similar to that of FIG. 11b) compared to the case of the jagged passband and huge insertion loss without termination.

2 and 3-µm-thick hollow-disk ring filters, with 1000 Å and 765 Å respectively, electro-to-resonator gaps were fabricated via a three-polysilicon self-aligned-and-filled stem process previously described to achieve GHz frequency ring resonators.

Figure 12:
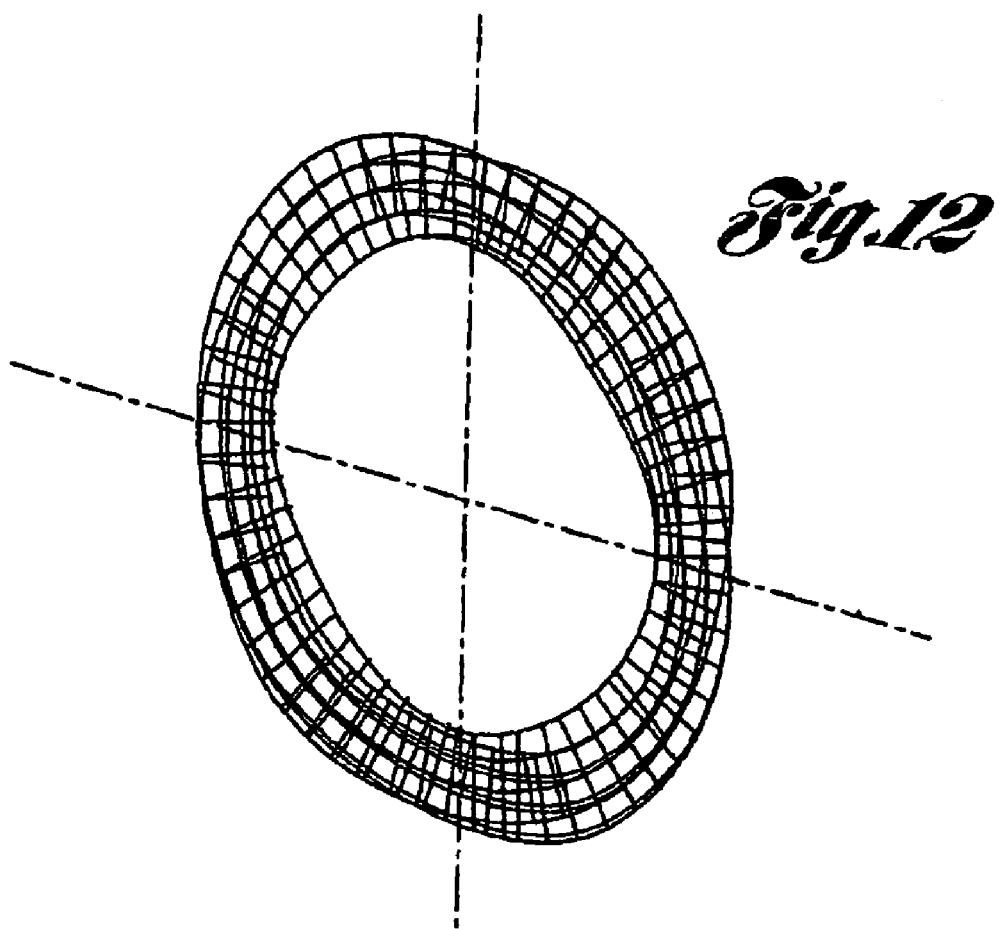
FIG. 12 is a wine-glass mode shape computed by a FEM Ansys package.

FIG. 12 shows the mode shape for the ring resonator obtained by the finite element analysis using the commercial package Ansys. As seen, the ring resonator has a wine-glass mode.

CONCLUSIONS

A "hollow-disk" ring resonator was described that used a centered, impedance-optimizing quarter-wavelength support structure with notched support-to-ring node attachments to achieve a record high Q of 14,603 at 1.2 GHz measured under vacuum. These values correspond to a frequency-Q product of $1.75 \times 10^{13}$, which is the highest yet seen for any polysilicon micromechanical resonator past 1 GHz, and which even exceeds the $1 \times 10^{13}$ typically posted by some of the best quartz crystals. The sheer performance of this device might now bring the concept of RF channel-select filters for ultra-low-power wireless receivers much closer to reality, and in doing so, could revolutionize the design of wireless RF front-ends. From the results of this work, the minimization of anchor losses through anchor isolation is clearly among the most important design criteria when designing micromechanical resonators for frequencies past 1 GHz, and will likely continue to dominate among Q-limiting dissipation mechanisms as frequencies are pushed towards 10 GHz and beyond.

The resonator may also exhibit an extensional wine-glass mode shape. Again, with the balanced supporting beams anchored in the center, the Q is greatly improved. Low frequency operation of the hollow resonator may also be provided. The ring of the hollow disk deforms like in the wine-glass mode. The length of the support beams can be designed to be multiple quarter wavelengths to maximize the Q (in this case, quarter wavelength of the flexural mode).

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A micromechanical resonator device having a desired mode shape, the device comprising:
    a substrate;
    a hollow radial resonator having an interior, a central cavity and a stationary surface area wherein the desired mode shape is characterized by a plurality of interior nodal points of a nodal circle located within the interior of the resonator between the cavity and an outer periphery of the resonator and wherein the desired mode shape involves movement of only a fraction of the stationary surface area at resonance and wherein the desired mode shape involves very little or no movement of the nodal circle at resonance; and
    a non-intrusive support structure anchored to the substrate and including a hub disposed within the cavity and extending from the substrate along an axis and a plurality of spokes which radiate radially from the hub and support the resonator above the substrate to reduce mechanical losses to the substrate and wherein the outer periphery expands and contracts in a plane normal to the axis at resonance.

2. The device as claimed in claim 1, wherein the resonator has a desired resonance frequency and wherein the spokes have a length based on the desired resonance frequency to reduce mechanical losses to the substrate.

3. The device as claimed in claim 2, wherein the spokes have inner and outer ends and wherein the outer ends of the spokes extend into the resonator adjacent the interior nodal points to reduce mechanical losses to the substrate.

4. The device as claimed in claim 1, further comprising a drive electrode structure adjacent the resonator for driving the resonator so that the resonator changes shape at resonance.

5. The device as claimed in claim 1, wherein the resonator is an extensional mode device having a compound mode that involves both radial and tangential displacement.

6. The device as claimed in claim 5, wherein the resonator is a hollowed-out disk resonator.

7. The device as claimed in claim 5, wherein the resonator is a ring resonator.

8. The device as claimed in claim 7, wherein the spokes have inner and outer ends and the ring resonator has an inner periphery and wherein interfaces between the outer ends and the inner periphery are acoustically matched.

9. The device as claimed in claim 1, wherein the non-invasive support structure forces the resonator to vibrate in the desired mode shape while suppressing any undesired mode shapes.

10. The device as claimed in claim 1, wherein the desired mode shape is a contour mode shape.

11. The device as claimed in claim 1, further comprising a drive electrode structure formed on the substrate at a position to allow electrostatic excitation of the resonator so that the resonator is driven in the desired mode shape and wherein the resonator and the drive electrode structure define a capacitive gap therebetween.

12. The device as claimed in claim 11, wherein the drive electrode structure is disposed with the central cavity of the resonator.

13. The device as claimed in claim 11, wherein the capacitive gap is a sub-micron, lateral, capacitive gap.

14. The device as claimed in claim 11, wherein the drive electrode structure includes a plurality of split electrodes.

15. The device as claimed in claim 1, wherein the support structure includes a single anchor positioned within the central cavity of the resonator.

16. The device as claimed in claim 11, further comprising a sense electrode structure formed on the substrate at a position to sense output current based on motion of the resonator.

17. The device as claimed in claim 16, wherein the drive electrode structure includes a plurality of separate input drive electrodes and the sense electrode structure includes a plurality of separate output sense electrodes.

18. The device as claimed in claim 1, wherein the device is silicon-based or a composite material having high acoustic velocity.

19. The device as claimed in claim 1, wherein the spokes have inner and outer ends and wherein the outer ends of the spokes extend into the resonator adjacent the interior nodal points to reduce mechanical losses to the substrate.

20. The device as claimed in claim 11, wherein the resonator is a ring resonator having inner and outer peripheries and wherein the drive electrode structure includes an inner set of electrodes disposed about the inner periphery between the spokes.

21. A micromechanical resonator device having a desired mode shape, the device comprising:
  a substrate;
  a radial resonator having an interior, a stationary surface area wherein the desired mode shape is characterized by a plurality of interior nodal points of a nodal circle located within the interior of the resonator between inner and outer lateral surfaces of the resonator and wherein the desired mode shape involves movement of only a fraction of the stationary surface area at resonance and wherein the desired mode shape involves very little or no movement of the nodal circle at resonance; and
  a non-intrusive support structure anchored to the substrate and extending from the substrate along an axis to support the resonator above the substrate wherein portions of the support structure radially extend into the resonator adjacent the interior nodal points to reduce mechanical losses to the substrate and wherein the inner and outer lateral surfaces of the resonator expand and contract in a plane normal to the axis at resonance.

22. The device as claimed in claim 21, wherein the portions of the support structure comprise spokes and wherein the resonator has a desired resonance frequency and wherein the spokes have a length based on the desired resonance frequency to reduce mechanical losses to the substrate.

23. The device as claimed in claim 22, wherein the spokes have inner and outer ends and wherein the outer ends of the spokes extend into the resonator adjacent the interior nodal points to reduce mechanical losses to the substrate.

24. The device as claimed in claim 21, further comprising a drive electrode structure adjacent the resonator for driving the resonator so that the resonator changes shape at resonance.

25. The device as claimed in claim 21, wherein the resonator is an extensional mode device having a compound mode that involves both radial and tangential displacement.

26. The device as claimed in claim 25, wherein the resonator is a hollowed-out disk resonator.

27. The device as claimed in claim 25, wherein the resonator is a ring resonator.

28. The device as claimed in claim 27, wherein the portions of the support structure comprise spokes having inner and outer ends and wherein the ring resonator has an inner periphery and wherein interfaces between the outer ends and the inner periphery are acoustically matched.

29. The device as claimed in claim 21, wherein the non-invasive support structure forces the resonator to vibrate in the desired mode shape while suppressing any undesired mode shapes.

30. The device as claimed in claim 21, wherein the desired mode shape is a contour mode shape.

31. The device as claimed in claim 21, further comprising a drive electrode structure formed on the substrate at a position to allow electrostatic excitation of the resonator so that the resonator is driven in the desired mode shape and wherein the resonator and the drive electrode structure define a capacitive gap therebetween.

32. The device as claimed in claim 31, wherein the drive electrode structure is disposed with a central cavity of the resonator.

33. The device as claimed in claim 31, wherein the capacitive gap is a sub-micron, lateral, capacitive gap.

34. The device as claimed in claim 31, wherein the drive electrode structure includes a plurality of split electrodes.

35. The device as claimed in claim 21, wherein the resonator includes a central cavity and wherein the support structure includes a single anchor positioned within the central cavity of the resonator.

36. The device as claimed in claim 31, further comprising a sense electrode structure formed on the substrate at a position to sense output current based on motion of the resonator.

37. The device as claimed in claim 36, wherein the drive electrode structure includes a plurality of separate input drive electrodes and the sense electrode structure includes a plurality of separate output sense electrodes.

38. The device as claimed in claim 21, wherein the device is silicon-based or a composite material having high acoustic velocity.

39. The device as claimed in claim 21, wherein the portions of the support structure comprise spokes using inner and outer ends and wherein the outer ends of the spokes extend into the resonator adjacent the interior nodal points to reduce mechanical losses to the substrate.

40. The device as claimed in claim 21, wherein the resonator is a ring resonator having inner and outer peripheries and wherein the drive electrode structure includes an inner set of electrodes disposed about the inner periphery.

41. A filter comprising:
  a substrate;
  a plurality of radial resonators, each of the resonators having a desired mode shape, an interior and a stationary surface area wherein the desired mode shape is characterized by a plurality of interior nodal points of a nodal circle located within the interior of the resonator between inner and outer lateral surfaces of the resonator and wherein the desired mode shape involves movement of only a fraction of the stationary surface area at resonance and wherein the desired mode shape involves very little or no movement of the nodal circle at resonance;
  a plurality of non-intrusive support structures, each of the support structures being anchored to the substrate and extending from the substrate along an axis to support it's respective resonator above the substrate wherein portions of each support structure radially extend into its respective resonator adjacent the interior nodal points to reduce mechanical losses to the substrate and wherein the inner and outer lateral surfaces of each of the resonators expand and contract in a plane normal to the axis at resonance; and
  a mechanism for coupling the resonators together to form the filter.

42. A filter comprising:
  a substrate;
  a plurality of hollow radial resonators, each of the resonators having a desired mode shape, an interior, a central cavity and a stationary surface area wherein the desired mode shape is characterized by a plurality of interior nodal points of a nodal circle located within the interior of the resonator between the cavity and an outer periphery of its resonator and wherein the desired mode shape involves movement of only a fraction of the stationary surface area at resonance and wherein the desired mode shape involves very little or no movement of the nodal circle at resonance;

a plurality of non-intrusive support structures, each of the support structures being anchored to the substrate and including a hub disposed within its respective cavity and extending from the substrate along an axis and a plurality of spokes which radiate radially from the hub and support its respective resonator above the substrate to reduce mechanical losses to the substrate and wherein the outer periphery expands and contracts in a plane normal to the axis at resonance; and a mechanism for coupling the resonators together to form the filter.

43. The device as claimed in claim 1, wherein the desired mode shape is a compound mode shape such as a wine-glass mode shape.

44. The device as claimed in claim 3, wherein the compound mode is a wine-glass mode.

45. The device as claimed in claim 1, wherein the desired mode shape is a wine-glass ring mode shape.

46. The device as claimed in claim 21, wherein the desired mode shape is a compound mode shape such as a wine-glass mode shape.

47. The device as claimed in claim 25, wherein the compound mode is a wine-glass mode.

48. The device as claimed in claim 21, wherein the desired mode shape is a wine-glass ring mode shape.

* * * * *